US009490763B2

(12) United States Patent
Taniguchi et al.

(10) Patent No.: US 9,490,763 B2
(45) Date of Patent: Nov. 8, 2016

(54) AUDIO SIGNAL OUTPUT DEVICE AND AUDIO OUTPUT SYSTEM

(71) Applicant: Funai Electric Co., Ltd., Daito-shi, Osaka (JP)

(72) Inventors: Atsushi Taniguchi, Daito (JP); Shigeki Otsuka, Daito (JP); Kota Hirai, Daito (JP); Yuichi Ito, Daito (JP); Takashi Fujii, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 345 days.

(21) Appl. No.: 13/777,502

(22) Filed: Feb. 26, 2013

(65) Prior Publication Data

US 2013/0259265 A1     Oct. 3, 2013

(30) Foreign Application Priority Data

Mar. 27, 2012    (JP) ................. 2012-070780

(51) Int. Cl.
| | |
|---|---|
| H03G 3/00 | (2006.01) |
| H03G 3/20 | (2006.01) |
| H03G 7/00 | (2006.01) |
| H03G 5/00 | (2006.01) |
| H03G 5/02 | (2006.01) |
| H03G 3/04 | (2006.01) |

(52) U.S. Cl.
CPC .................. *H03G 3/20* (2013.01); *H03G 3/04* (2013.01); *H03G 5/00* (2013.01); *H03G 5/02* (2013.01); *H03G 7/00* (2013.01)

(58) Field of Classification Search
CPC ............ H03G 7/00; H03G 5/02; H03G 5/00; H03G 3/20; H03G 3/04
USPC ......................................................... 381/107
See application file for complete search history.

(56) References Cited

U.S. PATENT DOCUMENTS

| | | | |
|---|---|---|---|
| 2002/0076066 A1* | 6/2002 | Yabe ........................ | H04S 7/00 381/104 |
| 2003/0223612 A1* | 12/2003 | Knorr et al. .................. | 381/370 |
| 2006/0013414 A1* | 1/2006 | Shih ..................... | H03G 3/3005 381/107 |
| 2010/0157172 A1 | 6/2010 | Chen et al. | |
| 2011/0142245 A1 | 6/2011 | Toba et al. | |
| 2011/0293113 A1* | 12/2011 | McCarthy ................ | H03G 3/32 381/107 |
| 2012/0128178 A1* | 5/2012 | Fujii ....................... | G10L 21/02 381/98 |

FOREIGN PATENT DOCUMENTS

| | | |
|---|---|---|
| JP | 2007-281569 A | 10/2007 |
| JP | 2008-228005 A | 9/2008 |
| JP | 2008-294759 A | 12/2008 |
| JP | 2009-21834 A | 1/2009 |
| JP | 2010-148083 A | 7/2010 |
| JP | 2011-124925 A | 6/2011 |
| JP | 2011-130236 A | 6/2011 |
| JP | 2011-160037 A | 8/2011 |

\* cited by examiner

*Primary Examiner* — Duc Nguyen
*Assistant Examiner* — Sean H Nguyen
(74) *Attorney, Agent, or Firm* — Crowell & Moring LLP

(57) ABSTRACT

This audio signal output device includes an audio signal output portion, a volume setting information acquisition portion, and a control portion acquiring maximum volume information of volume information of an audio signal of content. The control portion is configured to calculate the maximum output volume of an external device on the basis of the maximum volume information of the content and volume setting information of the external device and perform control of lowering the output volume of the external device when the maximum output volume is higher than a prescribed volume threshold.

20 Claims, 7 Drawing Sheets

CONTROL PROCESSING FLOW FOR VOLUME CHANGE OF AMPLIFIER

AUDIO SIGNAL OUTPUT DEVICE AND AUDIO OUTPUT SYSTEM

BACKGROUND OF THE INVENTION

1. Field of the Invention

The present invention relates to an audio signal output device and an audio output system, and more particularly, it relates to an audio signal output device and an audio output system each capable of outputting an audio signal of content.

2. Description of the Background Art

An audio signal output device capable of outputting an audio signal of content is known in general, as disclosed in Japanese Patent Laying-Open No. 2008-228005, for example.

Japanese Patent Laying-Open No. 2008-228005 discloses a video-audio processing apparatus including an audio output portion outputting an audio data signal of content to an audio output apparatus, an audio buffer portion accumulating the audio data signal of the content for a certain reproduction time and sequentially outputting the same to the audio output portion, a volume detection portion detecting a volume level from the audio data signal input from the audio buffer portion, a warning display data generation portion generating a warning display when a change value of the volume level is equal to or larger than a certain value, and a video output portion displaying the warning display on a display device. This video-audio processing apparatus is configured to previously notify a user by the warning display that a high volume is output in reproduction of the content. Thus, a mental burden on the user with respect to high volume output is reduced.

In the video-audio processing apparatus according to Japanese Patent Laying-Open No. 2008-228005, however, the warning display is only displayed when the change value of the volume level is equal to or larger than the certain value, so that a high volume may be disadvantageously output from the audio output apparatus.

SUMMARY OF THE INVENTION

The present invention has been proposed in order to solve the aforementioned problem, and an object of the present invention is to provide an audio signal output device and an audio output system each capable of suppressing audio output at a high volume.

An audio signal output device according to a first aspect of the present invention includes an audio signal output portion to output an audio signal of content to an external device outputting audio, a volume setting information acquisition portion to acquire volume setting information of the external device, and a control portion acquiring maximum volume information of volume information of the audio signal of the content, while the control portion is configured to calculate the maximum output volume of the external device on the basis of the maximum volume information of the content and the volume setting information of the external device and perform control of lowering the output volume of the external device when the maximum output volume is higher than a prescribed volume threshold.

In the audio signal output device according to the first aspect of the present invention, as hereinabove described, the control portion is configured to perform control of lowering the output volume of the external device when the maximum output volume of the external device is higher than the prescribed volume threshold, whereby audio output from the external device at a high volume higher than the volume threshold can be suppressed. Furthermore, the control portion calculates the maximum output volume of the external device on the basis of both the maximum volume information of the content and the volume setting information of the external device, whereby audio output from the external device at a high volume can be more reliably suppressed as compared with a case where the control of lowering the output volume is performed on the basis of only either the maximum volume information or the volume setting information.

In the aforementioned audio signal output device according to the first aspect, the control portion is preferably configured to notify a user to previously select whether or not to perform control of lowering the output volume of the external device when the maximum output volume is higher than the prescribed volume threshold. According to this structure, whether or not to allow audio output from the external device at a high volume is left to the determination of the user, and hence the audio of the content can be output from the external device at an output volume desired by the user.

In the aforementioned audio signal output device according to the first aspect, the control portion is preferably configured to acquire the maximum volume information of volume information of an audio signal of the entire content or volume information of an audio signal of an entire chapter of the content, calculate the maximum output volume of the external device on the basis of the maximum volume information of the content and the volume setting information of the external device, and perform control of lowering the output volume of the entire content or the output volume of the entire chapter of the content of the external device when the maximum output volume is higher than the prescribed volume threshold. According to this structure, the user listening to the audio can be inhibited from feeling uncomfortable due to audio output in a state where the output volume of the entire content or the output volume of the entire chapter of the content is partially lowered.

In the aforementioned audio signal output device according to the first aspect, the control portion is preferably configured to perform control of lowering the output volume of the external device by lowering at least one of an amplification rate constituting the volume information of the audio signal of the content and an amplification rate constituting the volume setting information of the external device when the maximum output volume is higher than the prescribed volume threshold. According to this structure, the amplification rate is lowered, whereby the output volume output from the external device can be easily lowered.

In this case, the control portion is preferably configured to perform control of lowering the output volume of the external device by lowering the amplification rate constituting the volume information of the audio signal of the content when the maximum output volume is higher than the prescribed volume threshold. According to this structure, it is not necessary for the control portion to instruct the external device to lower the amplification rate constituting the volume setting information of the external device, and hence the control of lowering the output volume of the external device can be easily performed.

In the aforementioned audio signal output device lowering the amplification rate constituting the volume information of the audio signal of the content, the control portion is preferably configured to acquire the maximum volume information of volume information of an audio signal of the entire content or volume information of an audio signal of an entire chapter of the content, calculate the maximum output volume of the external device on the basis of the maximum volume information of the content and the volume setting information of the external device, and perform control of lowering the output volume of the entire content or the output volume of the entire chapter of the content of the external device by lowering an amplification rate constituting the volume information of the audio signal of the entire content or the volume information of the audio signal of the entire chapter of the content when the maximum output volume is higher than the prescribed volume threshold. According to this structure, the amplification rate constituting the volume information of the audio signal of the entire content or the volume information of the audio signal of the entire chapter of the content is lowered, whereby the output volume of the entire content or the entire chapter of the content output from the external device can be easily lowered.

In the aforementioned audio signal output device according to the first aspect, the control portion is preferably configured to calculate the maximum output volume of the external device on the basis of an amplification rate constituting the maximum volume information of the content and an amplification rate constituting the volume setting information of the external device. According to this structure, the control portion can easily calculate the maximum output volume of the external device.

The aforementioned audio signal output device according to the first aspect preferably further includes a storage portion to previously store the audio signal of the content, and the control portion is preferably configured to perform control of previously acquiring the maximum volume information of the volume information of the audio signal of the content from the audio signal of the content stored in the storage portion. According to this structure, the control portion can perform control of lowering the output volume of the external device before the audio of the content is output from the external device, and hence audio output from the external device at a high volume can be reliably suppressed even immediately after reproduction of the content is started.

In this case, the control portion is preferably configured to previously acquire the maximum volume information of volume information of an audio signal of an entire chapter of the content stored in the storage portion for each chapter of the content, calculate the maximum output volume of the external device on the basis of the maximum volume information of the entire chapter of the content and the volume setting information of the external device each time the control portion acquires the maximum volume information of the entire chapter of the content, and perform control of lowering the output volume of the entire chapter of the content of the external device when the maximum output volume is higher than the prescribed volume threshold. According to this structure, the control of lowering the output volume of the entire chapter of the content can be performed each time the maximum volume information of the entire chapter of the content is acquired, and hence the audio of the content can be more promptly output from the external device, as compared with a case where the maximum volume information of the entire content is collectively acquired.

In the aforementioned audio signal output device according to the first aspect, the control portion is preferably configured to perform control of lowering the output volume of the external device so that the maximum output volume is substantially equal to the prescribed volume threshold when the maximum output volume is higher than the prescribed volume threshold. According to this structure, the audio of the content can be output from the external device in a state where the maximum output volume is maintained at an allowable magnitude (volume threshold) while audio output from the external device at a high volume is suppressed.

In this case, the control portion is preferably configured to calculate a modification value to render the maximum output volume substantially equal to the prescribed volume threshold when the maximum output volume is higher than the prescribed volume threshold and perform control of lowering the output volume of the external device on the basis of the modification value. According to this structure, the output volume is lowered on the basis of the modification value, whereby the maximum output volume can be more easily set at the allowable magnitude (volume threshold).

In the aforementioned audio signal output device calculating the modification value, the control portion is preferably configured to perform control of lowering the output volume of the external device by lowering at least one of an amplification rate constituting the volume information of the audio signal of the content and an amplification rate constituting the volume setting information of the external device on the basis of the modification value. According to this structure, the amplification rate is lowered on the basis of the modification value, whereby the output volume output from the external device can be easily lowered.

In the aforementioned audio signal output device according to the first aspect, the prescribed volume threshold is preferably settable by a user. According to this structure, the volume threshold can be set according to the user's preference.

In this case, the control portion is preferably configured to output an audio signal of a test tone to set the prescribed volume threshold to the external device, and the audio signal output device is preferably so configured that the user adjusts the output volume of the test tone output from the external device to set the prescribed volume threshold. According to this structure, the user can set the prescribed volume threshold while actually listening to the test tone output from the external device, and hence the volume threshold can be more easily set according to the user's preference.

In the aforementioned audio signal output device notifying the user, the control portion is preferably configured to notify the user to previously select whether or not to perform control of lowering the output volume of the external device by displaying a notification screen to cause the user to previously select whether or not to perform control of lowering the output volume of the external device on the external device. According to this structure, the user can be visually notified to select whether or not to perform control of lowering the output volume through the notification screen, and hence the audio signal output device can cause the user to clearly recognize the selection notification.

An audio output system according to a second aspect of the present invention includes an external device outputting audio and an audio signal output device including an audio signal output portion to output an audio signal of content to the external device, a volume setting information acquisition portion to acquire volume setting information of the external device, and a control portion acquiring maximum volume information of volume information of the audio signal of the content, while the control portion of the audio signal output device is configured to calculate the maximum output volume of the external device on the basis of the maximum volume information of the content and the volume setting information of the external device and perform control of lowering the output volume of the external device when the maximum output volume is higher than a prescribed volume threshold.

In the audio output system according to the second aspect of the present invention, as hereinabove described, the control portion of the audio signal output device is configured to perform control of lowering the output volume of the external device when the maximum output volume of the external device is higher than the prescribed volume threshold, whereby audio output from the external device at a high volume higher than the volume threshold can be suppressed. Furthermore, the control portion of the audio signal output device calculates the maximum output volume of the external device on the basis of both the maximum volume information of the content and the volume setting information of the external device, whereby audio output from the external device at a high volume can be more reliably suppressed as compared with a case where the control of lowering the output volume is performed on the basis of only either the maximum volume information or the volume setting information.

In the aforementioned audio output system according to the second aspect, the control portion of the audio signal output device is preferably configured to notify a user to previously select whether or not to perform control of lowering the output volume of the external device when the maximum output volume is higher than the prescribed volume threshold. According to this structure, whether or not to allow audio output from the external device at a high volume is left to the determination of the user, and hence the audio of the content can be output from the external device at an output volume desired by the user.

In the aforementioned audio output system according to the second aspect, the control portion of the audio signal output device is preferably configured to acquire the maximum volume information of volume information of an audio signal of the entire content or volume information of an audio signal of an entire chapter of the content, calculate the maximum output volume of the external device on the basis of the maximum volume information of the content and the volume setting information of the external device, and perform control of lowering the output volume of the entire content or the output volume of the entire chapter of the content of the external device when the maximum output volume is higher than the prescribed volume threshold. According to this structure, the user listening to the audio can be inhibited from feeling uncomfortable due to audio output in a state where the output volume of the entire content or the output volume of the entire chapter of the content is partially lowered.

In the aforementioned audio output system according to the second aspect, the control portion of the audio signal output device is preferably configured to calculate the maximum output volume of the external device on the basis of an amplification rate constituting the maximum volume information of the content and an amplification rate constituting the volume setting information of the external device. According to this structure, the control portion of the audio signal output device can easily calculate the maximum output volume of the external device.

The aforementioned audio output system according to the second aspect preferably further includes a storage portion to previously store the audio signal of the content, and the control portion of the audio signal output device is preferably configured to perform control of previously acquiring the maximum volume information of the volume information of the audio signal of the content from the audio signal of the content stored in the storage portion. According to this structure, the control portion of the audio signal output device can perform control of lowering the output volume of the external device before the audio of the content is output from the external device, and hence audio output from the external device at a high volume can be reliably suppressed even immediately after reproduction of the content is started.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of an audio-video output system 100 according to a first embodiment of the present invention is described with reference to FIGS. 1 to 4.

Figure 1:
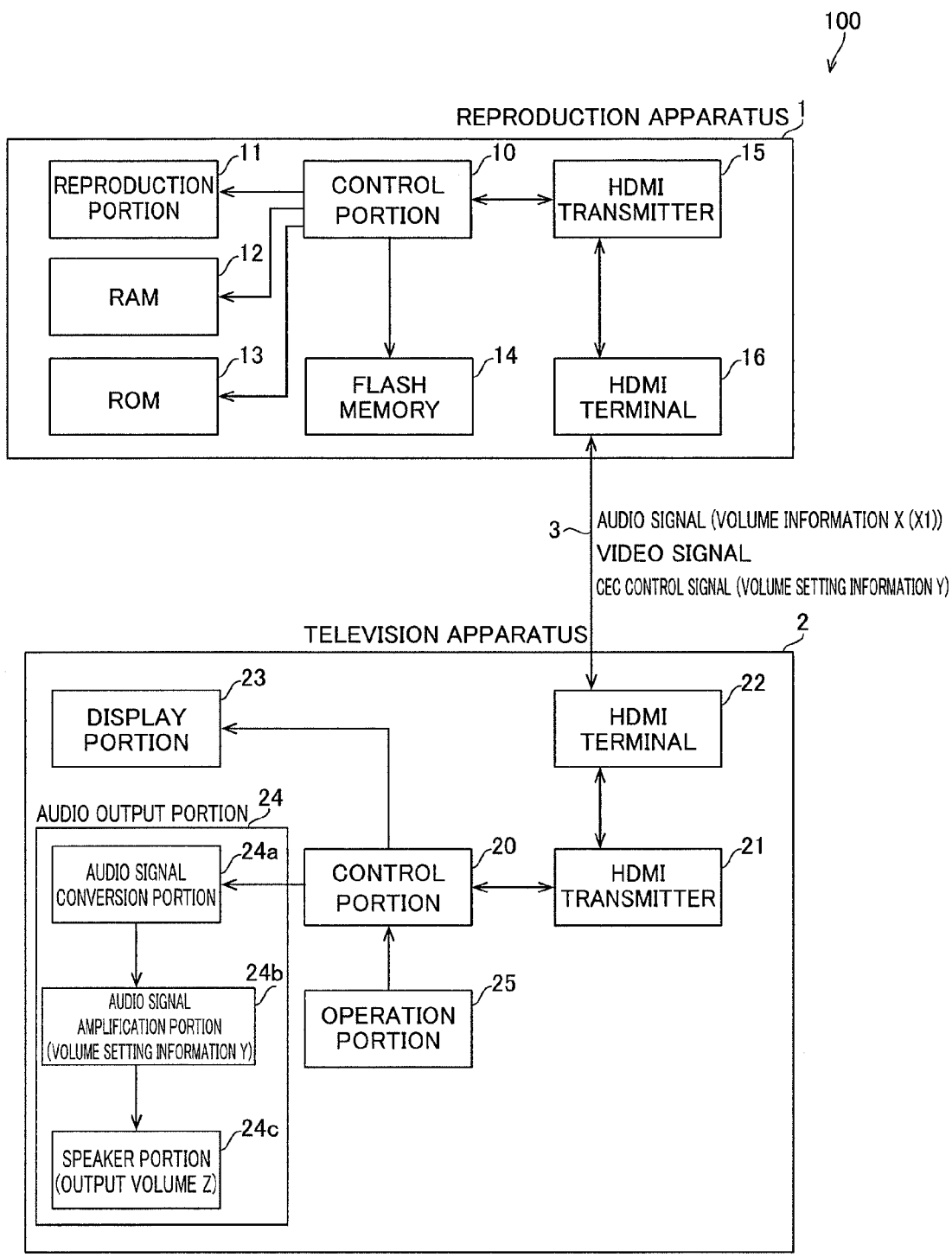
FIG. 1 is a block diagram showing the structure of an audio-video output system according to a first embodiment of the present invention.

The audio-video output system 100 according to the first embodiment of the present invention includes a reproduction apparatus 1 and a television apparatus 2, as shown in FIG. 1. The audio-video output system 100 is an example of the "audio output system" in the present invention, and the reproduction apparatus 1 and the television apparatus 2 are examples of the "audio signal output device" and the "external device" in the present invention, respectively.

The reproduction apparatus 1 and the television apparatus 2 are connected to each other by an HDMI (High-Definition Multimedia Interface) cable 3. Thus, the reproduction apparatus 1 is connected to be capable of outputting an audio signal and a video signal of content to the television apparatus 2.

The reproduction apparatus 1 includes a control portion 10, a reproduction portion 11, a RAM 12, a ROM 13, a flash memory 14, an HDMI transmitter 15, and an HDMI terminal 16 connected with the HDMI cable 3. The control portion 10 includes a CPU and is configured to control the operations of the entire reproduction apparatus 1 by executing a control program. The reproduction portion 11 has a function of retrieving the audio signal and the video signal constituting the content stored in a storage medium such as a VHS tape, a DVD, a BD, an LD, a USB memory, an SD card, or an HDD.

The RAM 12 is a rewritable volatile semiconductor memory, and the control portion 10 is configured to previously store the audio signal of the entire content in the RAM 12 before reproduction (before output to the television apparatus 2). The RAM 12 is an example of the "storage portion" in the present invention. The control portion 10 is configured to acquire volume information X (waveform shown by a one-dot chain line) shown in FIG. 2 from the audio signal of the entire content stored in the RAM 12.

The volume information X includes an amplification rate defined by $X=10 \times \log_{10}(P/P_0)$ (dB). $P_0$ represents a maximum voltage value (prescribed value) capable of being output from the reproduction apparatus 1, and P represents a voltage value actually output from the reproduction apparatus 1. In other words, $(P/P_0)$ is a value not greater than 1, and hence X is a value not greater than 0.

Figure 3:
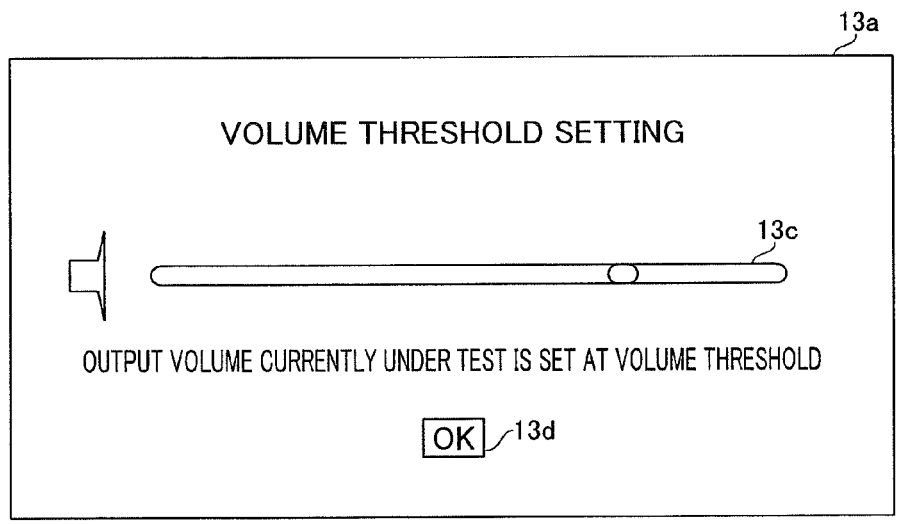
FIG. 3 illustrates a setting screen a user uses to set a volume threshold in the audio-video output system according to the first embodiment of the present invention.
Figure 4:
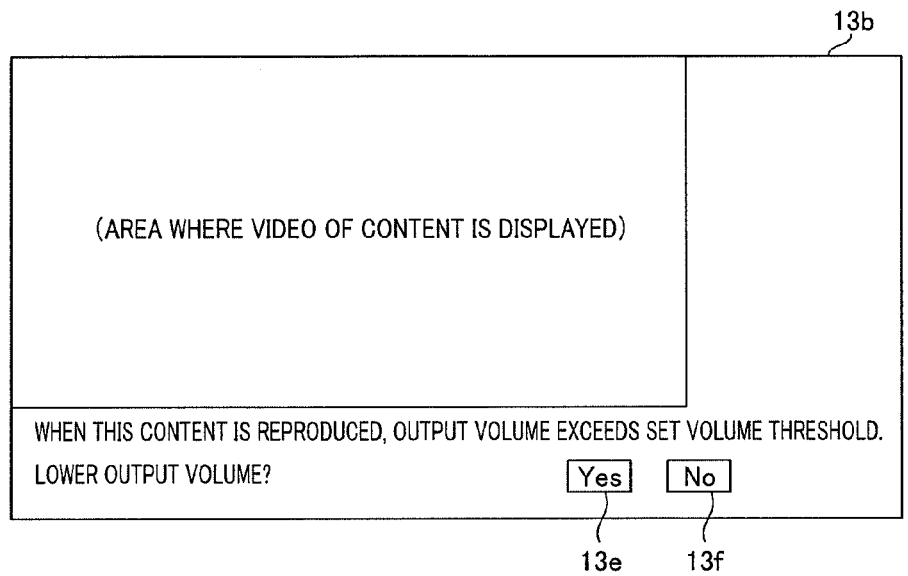
FIG. 4 illustrates a notification screen the user uses to select whether or not to lower the output volume in the audio-video output system according to the first embodiment of the present invention.

The ROM 13 is an unrewritable nonvolatile semiconductor memory and previously stores a video signal constituting a setting screen 13a shown in FIG. 3, an audio signal constituting a test tone, and a video signal constituting a notification screen 13b shown in FIG. 4. The audio-video output system 100 is so configured that a user can set a volume threshold $Z_{limit}$, which is the upper limit of an output volume output from the television apparatus 2, on the setting screen 13a, as shown in FIG. 3. Specifically, the user transversely slides a volume adjustment bar 13c in the setting screen 13a and selects an "OK" button 13d, whereby the user can set the volume threshold $Z_{limit}$ as an allowable output volume to be a desirable magnitude. The notification screen 13b is divided into a region where video of the content is displayed and a region where details of notification are displayed, as shown in FIG. 4. The user selects a "Yes" button 13e or a "No" button 13f in the region where the details of notification are displayed, whereby the user can select whether or not to perform control of lowering the output volume of the television apparatus 2.

The flash memory 14 is a rewritable nonvolatile semiconductor memory and is configured to store the volume threshold $Z_{limit}$ set by the user on the setting screen 13a (see FIG. 3).

The HDMI transmitter 15 has a function of outputting the audio signal and the video signal as a digital signal to the television apparatus 2 and a function of establishing bidirectional communication of a CEC (Consumer Electronics Control) control signal with the television apparatus 2. In addition, the HDMI transmitter 15 is configured to be capable of acquiring volume setting information Y described later of the television apparatus 2 using the CEC control signal. The HDMI transmitter 15 is an example of the "audio signal output portion" or the "volume setting information acquisition portion" in the present invention.

The television apparatus 2 includes a control portion 20, an HDMI transmitter 21, an HDMI terminal 22 connected with the HDMI cable 3, a display portion 23, an audio output portion 24, and an operation portion 25. The control portion 20 is configured to control the operations of the entire television apparatus 2. The HDMI transmitter 21 has a function of accepting input of the audio signal and the video signal from the reproduction apparatus 1 and a function of establishing bidirectional communication of the CEC control signal with the reproduction apparatus 1. The display portion 23 has a function of displaying video on the basis of the video signal.

The audio output portion 24 has an audio signal conversion portion 24a, an audio signal amplification portion 24b, and a speaker portion 24c. The voice signal conversion portion 24a has a function of converting the digital audio signal into an analog audio signal. The audio signal amplification portion 24b has a function of amplifying an audio signal having the volume information X from the reproduction apparatus 1 on the basis of the volume setting information Y. The volume setting information Y includes an amplification rate defined by $Y=10 \times \log_{10}(Q/Q_0)$ (dB). $Q_0$ represents a maximum voltage value (prescribed value) capable of being output from the audio signal amplification portion 24b, and Q represents a voltage value actually output from the audio signal amplification portion 24b. In other words, $(Q/Q_0)$ is a value not greater than 1, and hence Y is a value not greater than 0.

Figure 2:
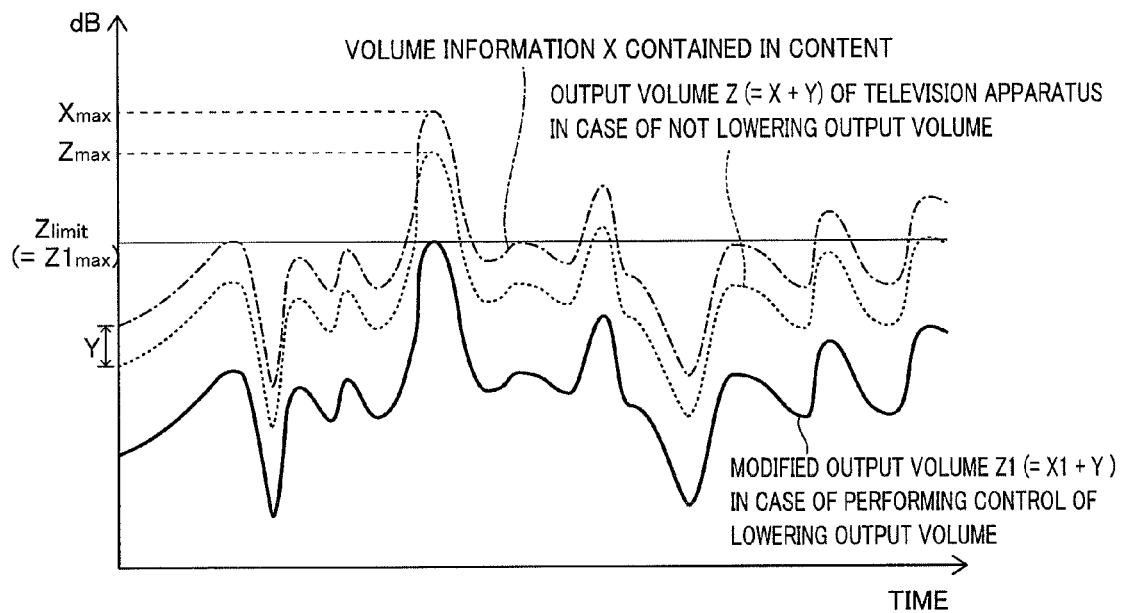
FIG. 2 is a schematic view showing that an output volume is lowered in the audio-video output system according to the first embodiment of the present invention.

Thus, the audio signal amplification portion 24b is configured to amplify the audio signal from the reproduction apparatus 1 to an output volume Z (=volume information X+volume setting information Y) (dB) (waveform shown by a broken line in FIG. 2). The speaker portion 24c is configured to output the audio of the content at the output volume Z.

The operation portion 25 has a function of accepting the operation of the user on the television apparatus 2 and the reproduction apparatus 1.

Second, control processing for setting performed by the control portion 10 of the reproduction apparatus 1 is described with reference to FIGS. 1, 3, and 5.

Figure 5:
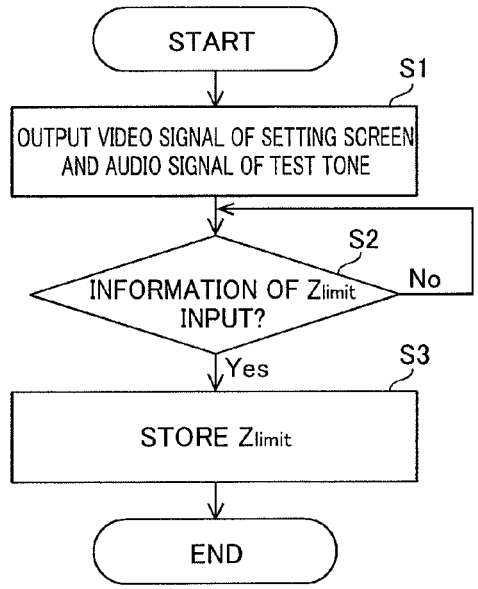
FIG. 5 illustrates a flow of control processing performed by a reproduction apparatus when the user sets the volume threshold in the audio-video output system according to the first embodiment of the present invention.

The user performs an operation of setting the volume threshold $Z_{limit}$ on an unshown menu screen, whereby the control portion 10 (see FIG. 1) of the reproduction apparatus 1 retrieves the video signal of the setting screen 13a (see FIG. 3) and the audio signal of the test tone from the ROM 13 (see FIG. 1) and outputs the same to the television apparatus 2 (see FIG. 1) at a step S1, as shown in FIG. 5. Thus, the setting screen 13a is displayed on the display portion 23 (see FIG. 1), and the test tone having a prescribed output volume is output from the speaker portion 24c (see FIG. 1). When the user slides the volume adjustment bar 13c to set the output volume adjusted to a certain volume as the volume threshold $Z_{limit}$ (selects the "OK" button 13d), information of the set volume threshold $Z_{limit}$ is output to the reproduction apparatus 1 using the CEC control signal.

Then, the control portion 10 determines whether or not the information of the volume threshold $Z_{limit}$ has been input at a step S2, and repeats this determination until the control portion 10 determines that the information of the volume threshold $Z_{limit}$ has been input. When determining that the information of the volume threshold $Z_{limit}$ has been input, the control portion 10 stores the volume threshold $Z_{limit}$ in the flash memory 14 (see FIG. 1) at a step S3. Then, the control portion 10 terminates the control processing. In this manner, setting of the volume threshold $Z_{limit}$ by the user is completed.

Third, control processing for volume change performed by the control portion 10 of the reproduction apparatus 1 is described with reference to FIGS. 1, 2, 4, and 6.

Figure 6:
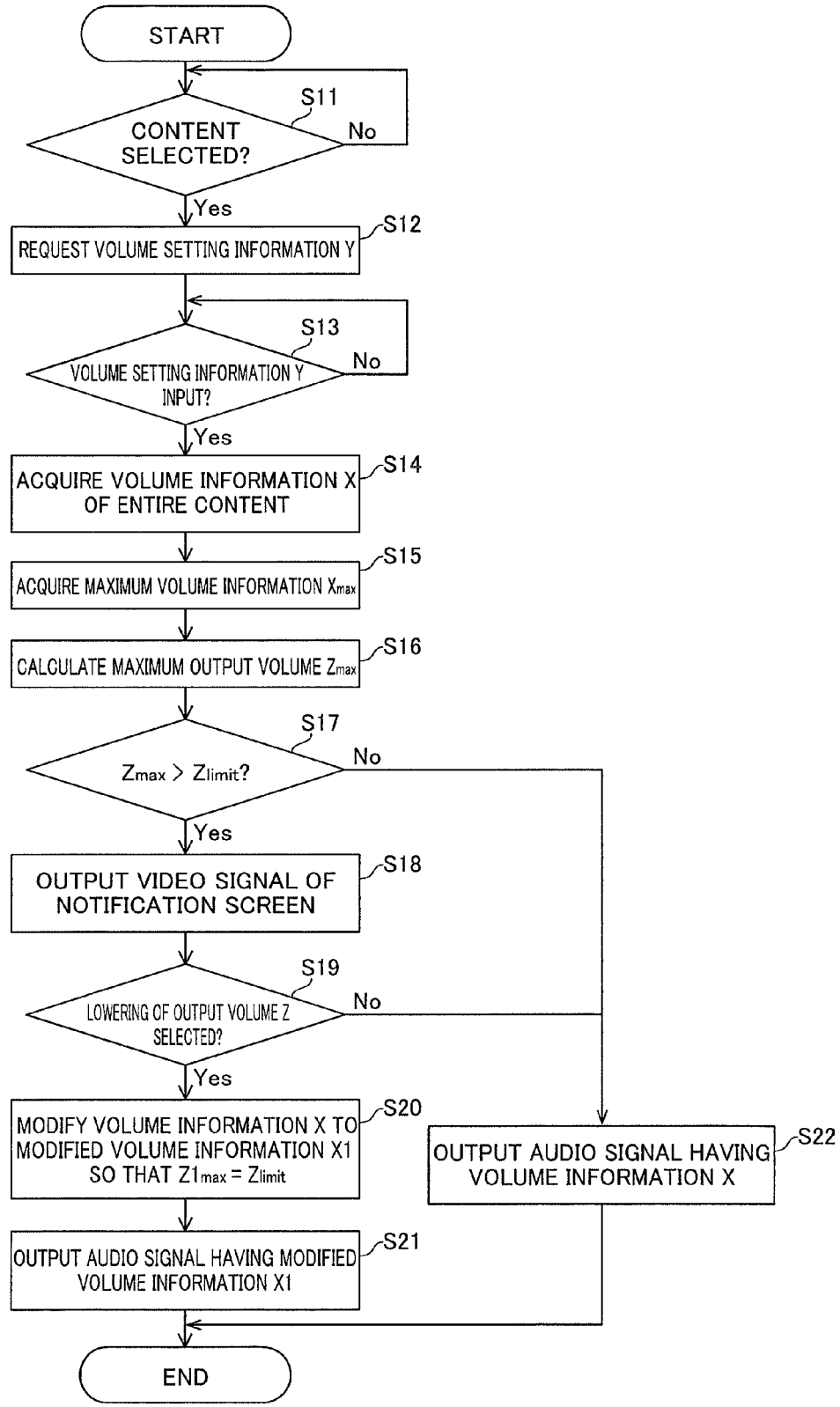
FIG. 6 illustrates a flow of control processing performed by the reproduction apparatus when the reproduction apparatus changes a volume to output audio from an external device in the audio-video output system according to the first embodiment of the present invention.

As shown in FIG. 6, the control portion 10 (see FIG. 1) of the reproduction apparatus 1 determines whether or not the content has been selected by the operation of the user or the like at a step S11, and repeats this determination until the control portion 10 determines that the content has been selected. When determining that the content has been selected, the control portion 10 requests the television apparatus 2 (see FIG. 1) to transmit the volume setting information Y using the CEC control signal at a step S12.

Thereafter, the control portion 10 determines whether or not the volume setting information Y has been input into the reproduction apparatus 1 from the television apparatus 2 at a step S13, and repeats this determination until the control portion 10 determines that the volume setting information Y has been input. When determining that the volume setting information Y has been input, the control portion 10 retrieves the audio signal of the entire content and temporarily stores the same in the RAM 12 (see FIG. 1), and acquires the volume information X (see FIG. 2) from the audio signal of the entire content at a step S14. Then, the control portion 10 acquires maximum volume information $X_{max}$ (see FIG. 2) of the volume information X at a step S15.

According to the first embodiment, the control portion 10 calculates the maximum output volume $Z_{max}$ ($=X_{max}+Y$) (see FIG. 2) of the television apparatus 2 on the basis of the maximum volume information $X_{max}$ contained in the content and the volume setting information Y that the television apparatus 2 has at a step S16. Then, the control portion 10 determines whether or not the maximum output volume $Z_{max}$ is higher than the volume threshold $Z_{limit}$ at a step S17. When determining that the maximum output volume $Z_{max}$ is higher than the volume threshold $Z_{limit}$ ($Z_{max} \geq Z_{limit}$) the control portion 10 retrieves the notification screen 13b (see FIG. 4) from the ROM 13 (see FIG. 1) and displays the same on the display portion 23 (see FIG. 1) of the television apparatus 2 at a step S18. In other words, the user is previously notified to select whether or not to perform control of lowering the output volume Z on the notification screen 13b displayed on the display portion 23 of the television apparatus 2. When the user selects whether or not to perform control of lowering the output volume (selects the "Yes" button 13e or the "No" button 13f (see FIG. 4)), information of whether or not to perform control of lowering the output volume is output to the reproduction apparatus 1 using the CEC control signal.

Thereafter, the control portion 10 determines whether or not lowering of the output volume Z of the television apparatus 2 has been selected at a step S19. When determining that lowering of the output volume Z has been selected (the "Yes" button 13e has been selected), the control portion 10 performs control of lowering the output volume Z of the entire content of the television apparatus 2 to a modified output volume Z1 at a step S20. Specifically, the volume information X of the audio signal of the entire content is so modified to modified volume information X1 that the maximum output volume $Z_{max}$ is a modified maximum output volume $Z1_{max}$ that is substantially equal to the volume threshold $Z_{limit}$, as shown in FIG. 2. In other words, a modification value γ1 for lowering the volume information X is calculated to satisfy $Z1_{max}=(Z_{limit})=X1_{max}+Y$ (see FIG. 2). Thus, the volume information X of the entire content is lowered to the modified volume information X1 ($=X \times \gamma 1$). In this case, the modified maximum volume information $X1_{max}$ is obtained as $X1_{max}=X_{max} \times \gamma 1$. Consequently, the output volume Z of the entire content is lowered to the modified output volume Z1 ($=X1+Y$) that is not higher than the volume threshold $Z_{limit}$. In FIG. 2, the waveform of the modified output volume Z1 is shown by a bold solid line.

Thereafter, the control portion 10 outputs an audio signal having the lowered modified volume information X1 to the television apparatus 2 at a step S21. Then, the control portion 10 terminates the control processing. Thus, in the audio signal amplification portion 24b (see FIG. 1) of the television apparatus 2, the audio signal is amplified to the modified output volume Z1 ($=X1+Y$) (dB), and the audio of the entire content is output from the speaker portion 24c (see FIG. 1) of the television apparatus 2 at the modified output volume Z1.

When determining that the maximum output volume $Z_{max}$ is not higher than the volume threshold $Z_{limit}$ at the step S17 or determining that lowering of the output volume Z has not been selected at the step S19, the control portion 10 outputs the audio signal having the volume information X including the maximum volume information $X_{max}$ to the television apparatus 2 without performing control of lowering the output volume Z (volume information X) at a step S22. Then, the control portion 10 terminates the control processing. Thus, in the audio signal amplification portion 24b, the audio signal is amplified to the output volume Z ($=X+Y$) (dB), and the audio of the entire content is output from the speaker portion 24c at the output volume Z.

According to the first embodiment, as hereinabove described, the control portion 10 is configured to lower the output volume Z of the television apparatus 2 to the modified output volume Z1 when the maximum output volume $Z_{max}$ of the television apparatus 2 is higher than the volume threshold $Z_{limit}$. Thus, audio output from the television apparatus 2 at a high volume higher than the volume threshold $Z_{limit}$ can be suppressed.

According to the first embodiment, as hereinabove described, the control portion 10 is configured to calculate the maximum output volume $Z_{max}$ of the television apparatus 2 on the basis of both the maximum volume information $X_{max}$ of the content and the volume setting information Y of the television apparatus 2. Thus, audio output from the television apparatus 2 at a high volume can be more reliably suppressed as compared with a case where the control of lowering the output volume Z is performed on the basis of only either the maximum volume information $X_{max}$ or the volume setting information Y. Furthermore, the control portion 10 can easily calculate the maximum output volume $Z_{max}$ of the television apparatus 2 using the maximum volume information $X_{max}$ and the volume setting information Y.

According to the first embodiment, as hereinabove described, the control portion 10 is configured to output the notification screen 13b retrieved from the ROM 13 to the television apparatus 2 and display the notification screen 13b to cause the user to previously select whether or not to perform control of lowering the output volume Z of the television apparatus 2 on the display portion 23 when determining that the maximum output volume $Z_{max}$ is higher than the volume threshold $Z_{limit}$. Thus, whether or not to allow audio output from the television apparatus 2 at a high volume is left to the determination of the user, and hence the audio of the entire content can be output from the television apparatus 2 at an output volume desired by the user.

According to the first embodiment, as hereinabove described, the control portion 10 is configured to acquire the volume information X from the audio signal of the entire content, acquire the maximum volume information $X_{max}$ of the content from the volume information X, calculate the maximum output volume $Z_{max}$ of the television apparatus 2 on the basis of the maximum volume information $X_{max}$ of the content and the volume setting information Y of the television apparatus 2, and lower the output volume Z of the entire content of the television apparatus 2 to the modified output volume Z1 when the maximum output volume $Z_{max}$ is higher than the volume threshold $Z_{limit}$. Thus, the user listening to the audio can be inhibited from feeling uncomfortable due to audio output in a state where the output volume Z of the entire content is partially lowered.

According to the first embodiment, as hereinabove described, the control portion 10 is configured to perform control of lowering the output volume Z of the entire content of the television apparatus 2 to the modified output volume Z1 by lowering the volume information X of the entire content including the amplification rate to the modified volume information X1 when the maximum output volume $Z_{max}$ is higher than the volume threshold $Z_{limit}$. Thus, the volume information X including the amplification rate is lowered to the modified volume information X1, whereby the output volume Z of the entire content output from the television apparatus 2 can be easily lowered to the modified output volume Z1.

According to the first embodiment, as hereinabove described, the control of lowering the volume information X of the audio signal of the entire content to the modified volume information X1 is performed in the reproduction apparatus 1. Thus, it is not necessary for the control portion 10 to instruct the television apparatus 2 to lower the volume setting information Y, and hence the control of lowering the output volume Z of the television apparatus 2 to the modified output volume Z1 can be easily performed.

According to the first embodiment, as hereinabove described, the control portion 10 is configured to previously store the audio signal of the entire content in the RAM 12 before reproduction (before output from the television apparatus 2), acquire the volume information X from the stored audio signal of the entire content, and acquire the maximum volume information $X_{max}$ of the content of the acquired volume information X. Thus, the control portion 10 can perform control of lowering the output volume Z of the television apparatus 2 to the modified output volume Z1 before the audio of the content is output from the television apparatus 2. Thus, audio output from the television apparatus 2 at a high volume can be reliably suppressed even immediately after reproduction of the content is started.

According to the first embodiment, as hereinabove described, the control portion 10 is configured to lower the output volume Z of the television apparatus 2 to the modified output volume Z1 by lowering the volume information X of the entire content to the modified volume information X1 so that the maximum output volume $Z_{max}$ becomes the modified maximum output volume $Z1_{max}$ that is substantially equal to the volume threshold $Z_{limit}$ when the maximum output volume $Z_{max}$ is higher than the volume threshold $Z_{limit}$. Thus, the audio of the content can be output from the television apparatus 2 in a state where the modified maximum output volume $Z1_{max}$ is maintained at an allowable magnitude (volume threshold $Z_{limit}$) while audio output from the television apparatus 2 at a high volume is suppressed.

According to the first embodiment, as hereinabove described, the control portion 10 is configured to calculate the modification value γ1 for lowering the volume information X to satisfy $Z1_{max}=(Z_{limit})=X1_{max}+Y$, lower the volume information X of the entire content including the amplification rate to the modified volume information X1 (=X×γ1), and output the audio signal having the lowered modified volume information X1 to the television apparatus 2 to output the audio of the entire content at the modified output volume Z1 (=X1+Y) (dB) from the speaker portion 24c of the television apparatus 2. Thus, the output volume Z is lowered on the basis of the modification value γ1, whereby the maximum output volume $Z1_{max}$ can be more easily set at the allowable magnitude (volume threshold $Z_{limit}$). Furthermore, the volume information X of the entire content including the amplification rate is lowered on the basis of the modification value γ1, whereby the output volume Z output from the television apparatus 2 can be easily lowered.

According to the first embodiment, as hereinabove described, the volume threshold $Z_{limit}$ is set by the user, whereby the volume threshold $Z_{limit}$ can be set according to the user's preference.

According to the first embodiment, as hereinabove described, the audio-video output system 100 is so configured that the control portion 10 retrieves the audio signal of the test tone from the ROM 13 (see FIG. 1) and outputs the same to the television apparatus 2 to output the test tone having the prescribed output volume from the speaker portion 24c, and the user slides the volume adjustment bar 13c to set the output volume adjusted to the certain volume as the volume threshold $Z_{limit}$. Thus, the user can set a prescribed volume threshold $Z_{limit}$ while actually listening to the test tone output from the television apparatus 2, and hence the volume threshold $Z_{limit}$ can be more easily set according to the user's preference.

According to the first embodiment, as hereinabove described, the control portion 10 is configured to notify the user to select whether or not to perform control of lowering the output volume Z on the notification screen 13b displayed on the display portion 23 of the television apparatus 2. Thus, the user can be visually notified to select whether or not to perform control of lowering the output volume Z through the notification screen 13b, and hence the audio-video output system 100 can cause the user to clearly recognize the selection notification.

Second Embodiment

First, the structure of an audio-video output system 200 according to a second embodiment of the present invention is described with reference to FIGS. 7 to 10. In this second embodiment, control of lowering an output volume is performed in an amplifier 204 interposed between a reproduction apparatus 201 and a television apparatus 2, dissimilarly to the first embodiment.

Figure 7:
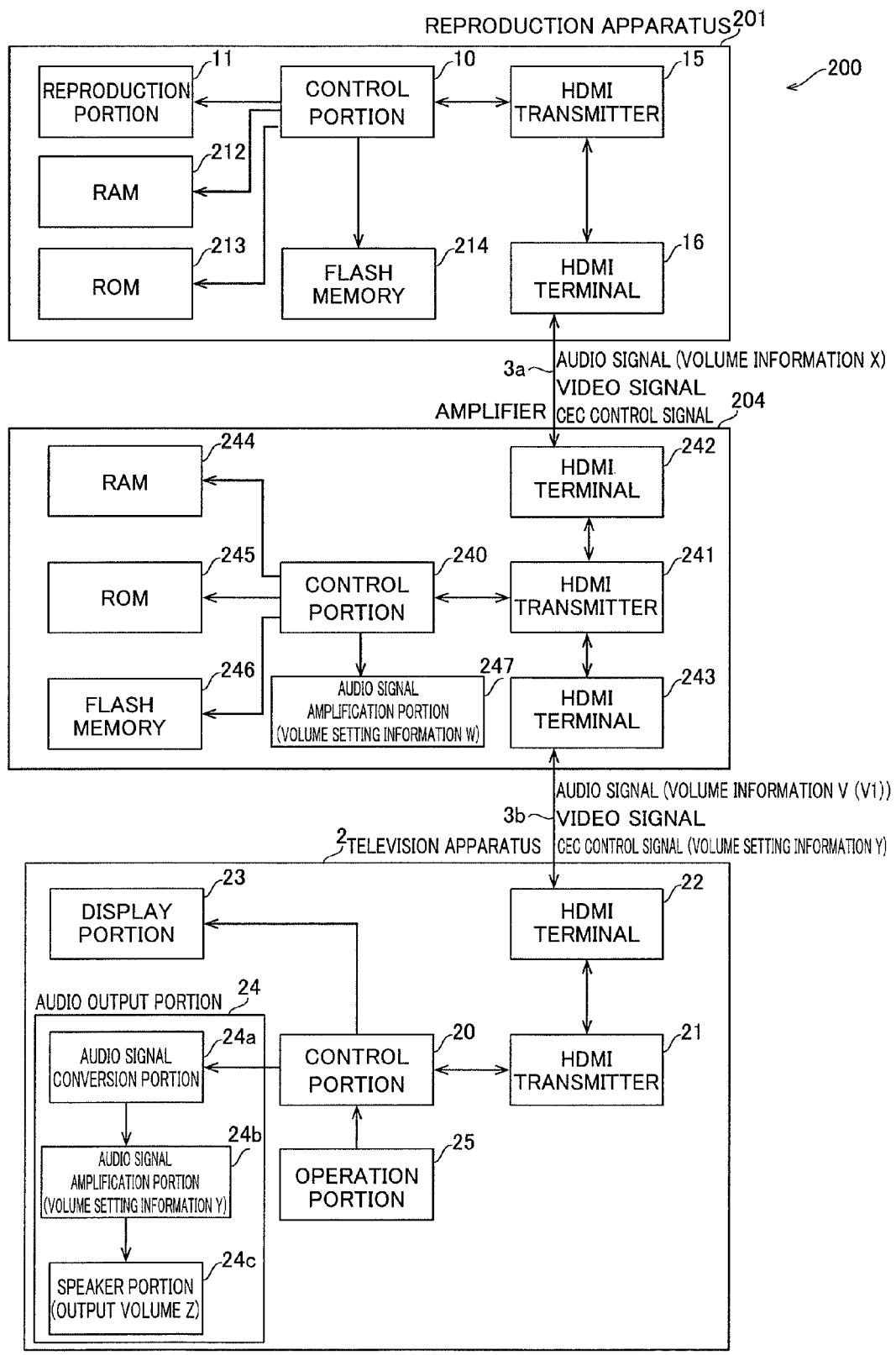
FIG. 7 is a block diagram showing the structure of an audio-video output system according to a second embodiment of the present invention.

The audio-video output system 200 according to the second embodiment of the present invention includes the reproduction apparatus 201, the television apparatus 2, and the amplifier 204 disposed between the reproduction apparatus 201 and the television apparatus 2, as shown in FIG. 7. The audio-video output system 200 is an example of the "audio output system" in the present invention, and the amplifier 204 is an example of the "audio signal output device" in the present invention.

The reproduction apparatus 1 and the amplifier 204 are connected to each other by an HDMI cable 3a, and the amplifier 204 and the television apparatus 2 are connected to each other by an HDMI cable 3b. Thus, the reproduction apparatus 1 is connected to be capable of outputting an audio signal and a video signal to the television apparatus 2 through the amplifier 204.

The amplifier 204 includes a control portion 240, an HDMI transmitter 241, an HDMI terminal 242 connected with the HDMI cable 3a, an HDMI terminal 243 connected with the HDMI cable 3b, a RAM 244, a ROM 245, a flash memory 246, and an audio signal amplification portion 247. The HDMI transmitter 241 has a function of outputting the audio signal and the video signal input from the reproduction apparatus 201 to the television apparatus 2 and a function of establishing bidirectional communication of a CEC control signal with the reproduction apparatus 201 and the television apparatus 2. In addition, the HDMI transmitter 241 is configured to be capable of acquiring volume setting information Y of the television apparatus 2 using the CEC control signal. The HDMI transmitter 241 is an example of the "audio signal output portion" or the "volume setting information acquisition portion" in the present invention.

Figure 8:
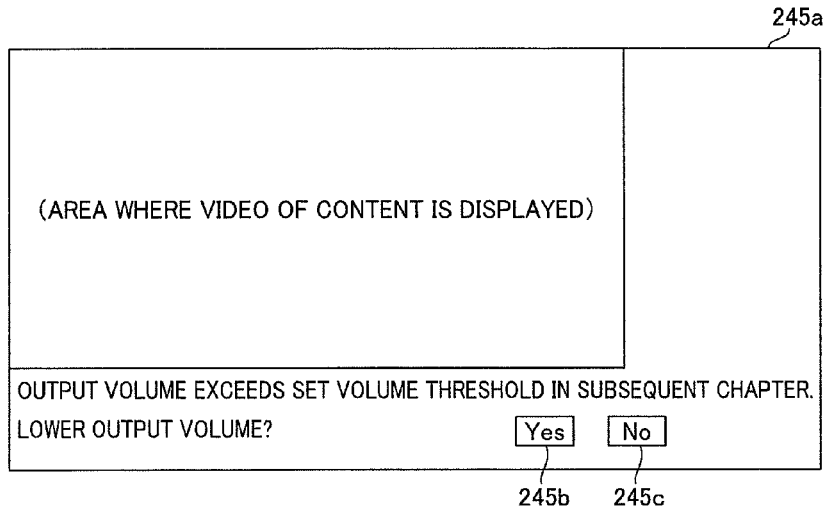
FIG. 8 illustrates a notification screen a user uses to select whether or not to lower an output volume in the audio-video output system according to the second embodiment of the present invention.

The RAM 244 previously stores the audio signal of content input from the reproduction apparatus 201. The content is formed by connecting a plurality of chapters. The RAM 244 is an example of the "storage portion" in the present invention. The ROM 245 and the flash memory 246 previously store a video signal constituting a notification screen 245a shown in FIG. 8 and a volume threshold $Z_{limit}$, respectively. On the notification screen 245a, a user selects a "Yes" button 245b or a "No" button 245c in a region where the details of notification are displayed, as shown in FIG. 8, whereby the user can select whether or not to perform control of lowering the output volume of the television apparatus 2 in the chapters. On the other hand, a RAM 212, a ROM 213, and a flash memory 214 of the reproduction apparatus 201 do not store the audio signal of the content, the video signal of the notification screen, and the volume threshold $Z_{limit}$, respectively.

The control portion 240 is configured to acquire volume information X of an entire chapter for each of the chapters from the audio signal of the content stored in the RAM 244. The audio signal amplification portion 247 has a function of amplifying an audio signal having the volume information X from the reproduction apparatus 201 on the basis of volume setting information W. The volume setting information W includes an amplification rate defined by $W=10\times\log_{10}(R/R_0)$ (dB). $R_0$ represents a maximum voltage value (prescribed value) capable of being output from the audio signal amplification portion 247, and R represents a voltage value actually output from the audio signal amplification portion 247. In other words, $(R/R_0)$ is a value not greater than 1, and hence W is a value not greater than 0.

Figure 9:
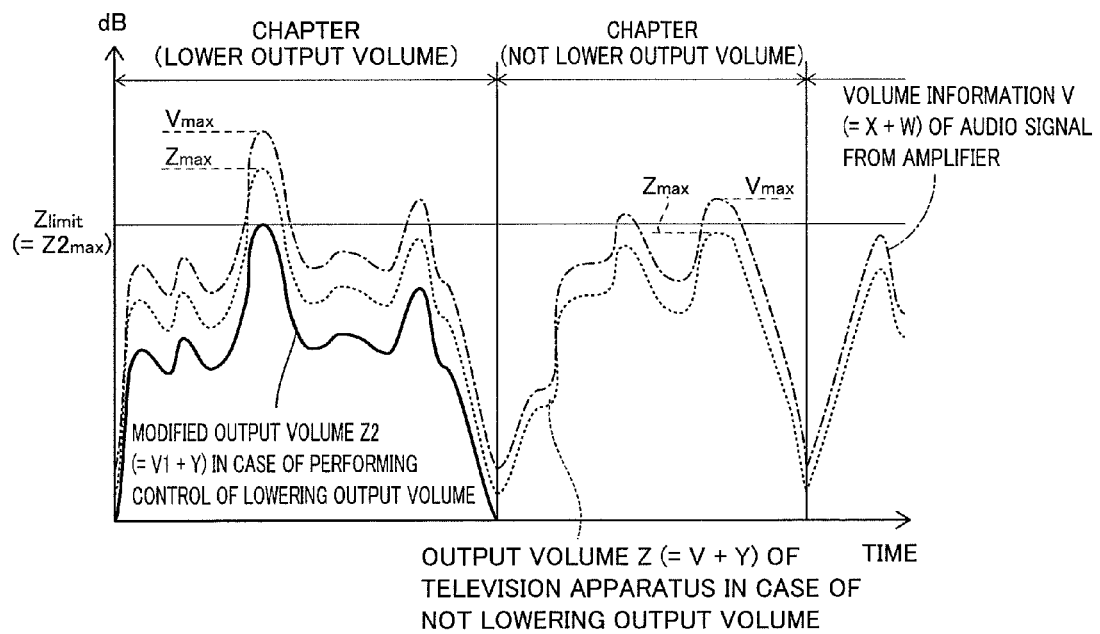
FIG. 9 is a schematic view showing that the output volume is lowered in the audio-video output system according to the second embodiment of the present invention.

Thus, the audio signal amplification portion 247 is configured to amplify the audio signal from the reproduction apparatus 201 to volume information V (=volume information X+volume setting information W) (dB) (waveform shown by a one-dot chain line in FIG. 9). Thus, the audio-video output system 200 is configured to output an audio signal having the volume information V from the HDMI transmitter 241 to the television apparatus 2. Consequently, the audio-video output system 200 is so configured that the audio signal from the amplifier 204 is amplified to an output volume Z (=volume information V+volume setting information Y) (dB) (waveform shown by a broken line in FIG. 9) in an audio signal amplification portion 24b of the television apparatus 2 and the audio of the content is output from a speaker portion 24c. The remaining structure of the audio-video output system 200 according to the second embodiment of the present invention is similar to that of the audio-video output system 100 according to the aforementioned first embodiment.

Second, control processing for volume change performed by the control portion 240 of the amplifier 204 is described with reference to FIGS. 7 to 10.

Figure 10:
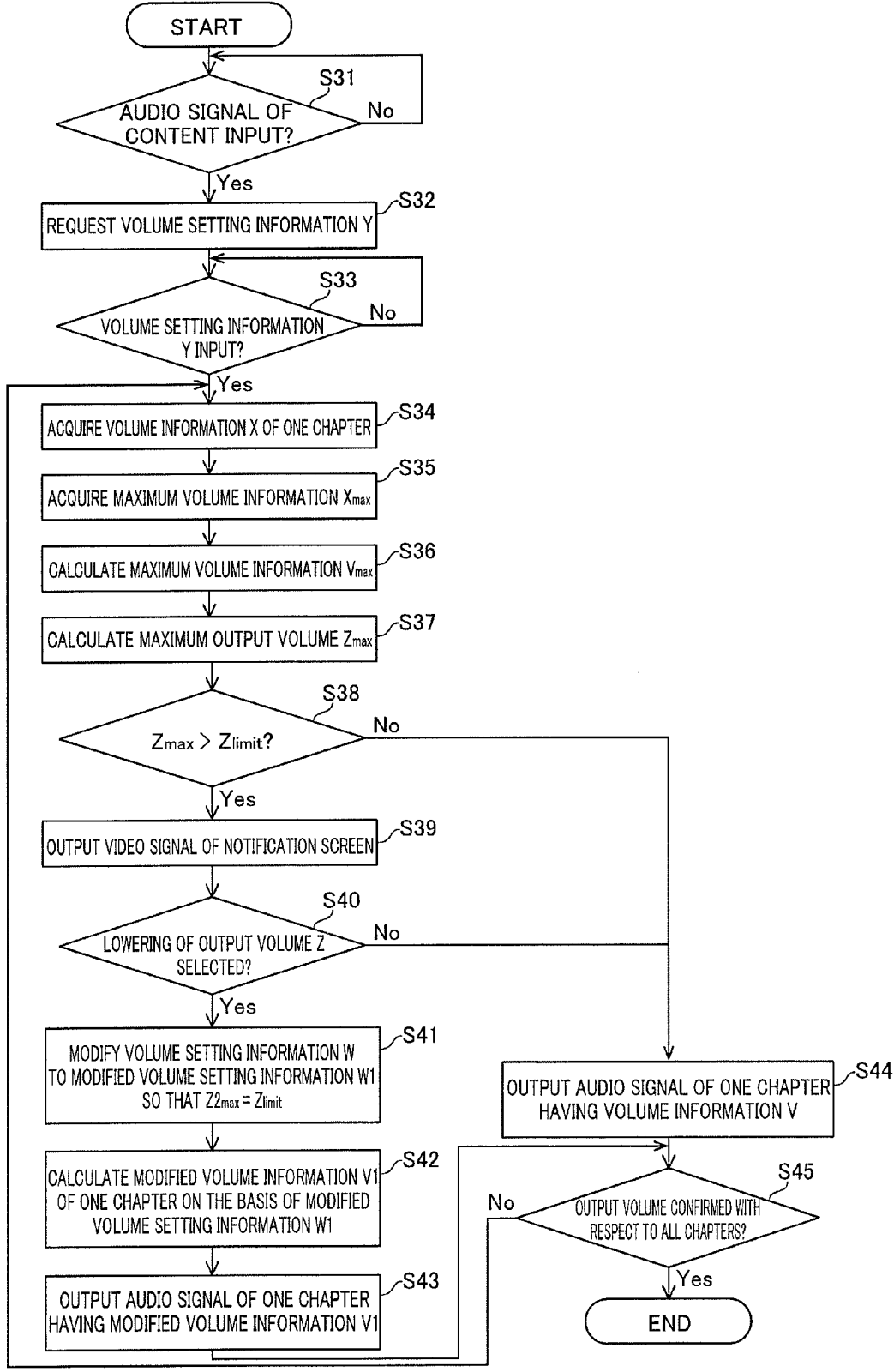
FIG. 10 illustrates a flow of control processing performed by an amplifier when the amplifier changes a volume to output audio from an external device in the audio-video output system according to the second embodiment of the present invention.

At a step S31, the control portion 240 (see FIG. 7) of the amplifier 204 determines whether or not the audio signal of the content has been input from the reproduction apparatus 201 (see FIG. 7), as shown in FIG. 10, and repeats this determination until the control portion 240 determines that the audio signal of the content has been input. When determining that the audio signal of the content has been input, the control portion 240 requests the television apparatus 2 (see FIG. 7) to transmit the volume setting information Y at a step S32.

Thereafter, the control portion 240 determines whether or not the volume setting information Y has been input from the television apparatus 2 into the amplifier 204 at a step S33, and repeats this determination until the control portion 240 determines that the volume setting information Y has been input. When determining that the volume setting information Y has been input, the control portion 240 retrieves the audio signal of the content, temporarily stores the same in the RAM 244 (see FIG. 7), and acquires the volume information X of one chapter at a step S34, and acquires maximum volume information $X_{max}$ of the volume information X of one chapter at a step S35. Then, the control portion 240 calculates maximum volume information $V_{max}$ (=$X_{max}$+W) (see FIG. 9) from the maximum volume information $X_{max}$ and the volume setting information W of the audio signal amplification portion 247 at a step S36, and calculates a maximum output volume $Z_{max}$ (=$X_{max}$+W+Y) (see FIG. 9) at a step S37.

The control portion 240 determines whether or not the maximum output volume $Z_{max}$ is higher than the volume threshold $Z_{limit}$ at a step S38. When determining that the maximum output volume $Z_{max}$ is higher than the volume threshold $Z_{limit}$ ($Z_{max}$>$Z_{limit}$), the control portion 240 retrieves the notification screen 245a (see FIG. 8) from the ROM 245 (see FIG. 7) and displays the same on a display portion 23 (see FIG. 7) at a step S39. When the user selects whether or not to perform control of lowering the output volume Z (selects the "Yes" button 245b or the "No" button 245c (see FIG. 8)), information of whether or not to perform control of lowering the output volume is output to the amplifier 204 using the CEC control signal.

The control portion 240 determines whether or not lowering of the output volume Z of the television apparatus 2 has been selected at a step S40. When determining that lowering of the output volume Z has been selected (the "Yes" button 245b has been selected), the control portion 240 performs control of lowering the output volume Z of one chapter of the television apparatus 2 to a modified output volume Z2 at a step S41. Specifically, the volume setting information W of the amplifier 204 is so lowered to modified volume setting information W1 that the maximum output volume $Z_{max}$ is a modified maximum output volume $Z2_{max}$ that is substantially equal to the volume threshold $Z_{limit}$, as shown in FIG. 9. In other words, a modification value γ2 of the modified volume setting information W1 (=W×γ2) is calculated to satisfy the modified maximum output volume $Z2_{max}$=($Z_{limit}$)=$V1_{max}$+Y=$X_{max}$+W1+Y (see FIG. 9). Consequently, the volume information V of the audio signal of the content of one chapter output from the amplifier 204 is lowered to a modified volume information V1 (=X×W1), and the output volume Z of the content of one chapter is lowered to the modified output volume Z2 (=V1+Y) not higher than the volume threshold $Z_{limit}$. In FIG. 9, the waveform of the modified output volume Z2 is shown by a bold solid line.

Thereafter, the control portion 240 calculates the modified volume information V1 (=X+W1) of one chapter on the basis of the lowered modified volume setting information W1 at a step S42, and outputs an audio signal having the lowered modified volume information V1 to the television apparatus 2 at a step S43. Then, the control portion 240 advances to a step S45. Thus, the audio signal is amplified to the modified output volume Z2 (=X+W1+Y) (dB) in the audio signal amplification portion 24b (see FIG. 7) of the television apparatus 2, and the audio of the content of one chapter is output from the speaker portion 24c (see FIG. 7) of the television apparatus 2 at the modified output volume Z2.

When determining that the maximum output volume $Z_{max}$ is not higher than the volume threshold $Z_{limit}$ at the step S38 or determining that lowering of the output volume Z has not been selected at the step S40, the control portion 240 outputs the audio signal having the volume information V to the television apparatus 2 without performing control of lowering the output volume Z (volume setting information W) at a step S44. Then, the control portion 240 advances to the step S45. Thus, the volume information V is amplified to the output volume Z (=X+W+Y) (dB) in the audio signal amplification portion 24b, and the audio of the content of one chapter is output from the speaker portion 24c at the output volume Z.

Thereafter, the control portion 240 determines whether or not the output volume Z has been confirmed with respect to all the chapters at the step S45. When determining that the output volume Z has not been confirmed with respect to all the chapters, the control portion 240 returns to the step S34 and confirms the output volume Z of a subsequent chapter. Consequently, the output volume Z is confirmed for each of the chapters constituting the content, and the audio of the content of one chapter is output from the speaker portion 24c of the television apparatus 2 at the output volume Z or the modified output volume Z2. When determining that the output volume Z has been confirmed with respect to all the chapters, the control portion 240 terminates the control processing.

According to the second embodiment, as hereinabove described, the control portion 240 is configured to perform control of lowering the output volume Z of the television apparatus 2 to the modified output volume Z2 when the maximum output volume $Z_{max}$ is higher than the volume threshold $Z_{limit}$. Thus, audio output from the television apparatus 2 at a high volume higher than the volume threshold $Z_{limit}$ can be suppressed.

According to the second embodiment, as hereinabove described, the control portion 240 is configured to acquire the volume information X from the audio signal of the entire chapter (one chapter) of the content, acquire the maximum volume information $X_{max}$ of the content from the volume information X, calculate the maximum output volume $Z_{max}$ (=$X_{max}$+W+Y) of the television apparatus 2 on the basis of the maximum volume information $X_{max}$ of the content, the volume setting information W of the amplifier 204, and the volume setting information Y of the television apparatus 2, and perform control of lowering the output volume Z of one chapter of the content of the television apparatus 2 to the modified output volume Z2 when the maximum output volume $Z_{max}$ is higher than the volume threshold $Z_{limit}$. Thus, the user listening to the audio can be inhibited from feeling uncomfortable due to audio output in a state where the output volume Z of the entire chapter of the content is partially lowered. Furthermore, the output volume Z can be changed between chapters in which the output volumes Z are low and changes in the output volumes Z are hardly perceived, and hence the audio-video output system 200 can make it hard for the user to feel the change in the output volume Z.

According to the second embodiment, as hereinabove described, the control portion 240 is configured to lower the output volume Z of one chapter of the content of the television apparatus 2 to the modified output volume Z2 by lowering the volume information V of the audio signal of the entire chapter (one chapter) of the content to the modified volume information V1 when the maximum output volume $Z_{max}$ is higher than the volume threshold $Z_{limit}$. Thus, the volume setting information W is lowered to the modified volume setting information W1, whereby the output volume Z of the entire chapter of the content output from the television apparatus 2 can be easily lowered to the modified output volume Z2. Furthermore, the control of lowering the volume setting information W of the entire chapter of the content to the modified volume setting information W1 can be performed in the amplifier 204, and hence it is not necessary for the control portion 240 to instruct the television apparatus 2 to lower the volume setting information Y. Thus, the control of lowering the output volume Z of the television apparatus 2 to the modified output volume Z2 can be easily performed.

According to the second embodiment, as hereinabove described, the control portion 240 is configured to acquire the maximum volume information $X_{max}$ of the volume information X of one chapter, calculate the maximum output volume $Z_{max}$ (=$X_{max}$+W+Y), confirm the output volume Z for each of the chapters constituting the content, and perform control of lowering the output volume Z of one chapter of the television apparatus 2 to the modified output volume Z2 when determining that the maximum output volume $Z_{max}$ is higher than the volume threshold $Z_{limit}$ ($Z_{max}$ $Z_{limit}$) to output the audio of the content of one chapter from the speaker portion 24c of the television apparatus 2 at the modified output volume Z2 (=X+W1+Y) (dB). Thus, the control of lowering the output volume Z of the entire chapter of the content to the modified output volume Z2 can be performed each time the maximum volume information $X_{max}$ of the entire chapter of the content is acquired, and hence the audio of the content can be more promptly output from the television apparatus 2, as compared with a case where the maximum volume information $X_{max}$ of the entire content is collectively acquired. The remaining effects of the second embodiment of the present invention are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the output volume Z (=X+Y) of the television apparatus 2 is lowered to the modified output volume Z1 (=X1+Y) by lowering the original volume information X of the reproduction apparatus 1 to the modified volume information X1 (X>X1) in the aforementioned first embodiment, the present invention is not restricted to this.

According to the present invention, the volume setting information Y of the television apparatus 2 may alternatively be lowered. Furthermore, the control of lowering the output volume Z of the television apparatus 2 may alternatively be performed by changing (adjusting) both the volume information X of the reproduction apparatus 1 and the volume setting information Y of the television apparatus 2.

While the output volume Z (=X+W+Y) of the television apparatus 2 is lowered to the modified output volume Z2 (=X+W1+Y) by lowering the volume setting information W of the amplifier 204 to the modified volume setting information W1 in the aforementioned second embodiment, the present invention is not restricted to this. According to the present invention, only the volume information X input from the reproduction apparatus 201 may alternatively be lowered, or only the volume setting information Y of the television apparatus 2 may alternatively be lowered. Furthermore, the output volume Z of the television apparatus 2 may alternatively be lowered by changing two or all three of the volume information X of the reproduction apparatus 201, the volume setting information W of the amplifier 204, and the volume setting information Y of the television apparatus 2.

While the "maximum output volume of the external device" according to the present invention is lowered to be substantially equal to the volume threshold in each of the aforementioned first and second embodiments, the present invention is not restricted to this. According to the present invention, the control of lowering the output volume may simply be performed. In order to suppress excessive lowering of the output volume while suppressing audio output at a high volume, the maximum output volume is preferably lowered to be a value close to the volume threshold.

While the notification screen to cause the user to previously select whether or not to perform control of lowering the output volume Z is displayed on the display portion of the television apparatus in each of the aforementioned first and second embodiments, the present invention is not restricted to this. For example, the user may alternatively be notified to select whether or not to perform control of lowering the output volume with audio not the notification screen.

While the reproduction apparatus 1 and the television apparatus 2 are used as the audio signal output device according to the present invention and the external device according to the present invention, respectively to form the audio-video output system 100 in the aforementioned first embodiment and the amplifier 204 and the television apparatus 2 are used as the audio signal output device according to the present invention and the external device according to the present invention, respectively to form the audio-video output system 200 in the aforementioned second embodiment, the present invention is not restricted to this. For example, the reproduction apparatus may alternatively be used as the audio signal output device according to the present invention, and an amplifier including a speaker portion capable of outputting audio may alternatively be used as the external device according to the present invention. Furthermore, the audio-video output system may alternatively be constituted by a device formed by integrally combining the reproduction apparatus, the amplifier, and the television apparatus.

While the reproduction apparatus 1 and the television apparatus 2 are connected to each other by the HDMI cable 3 to establish bidirectional communication in the aforementioned first embodiment, and the reproduction apparatus 201 and the amplifier 204 are connected to each other by the HDMI cable 3a and the amplifier 204 and the television apparatus 2 are connected to each other by the HDMI cable 3b to establish bidirectional communication in the aforementioned second embodiment, the present invention is not restricted to this. For example, the two apparatuses may alternatively be connected to each other by wired LAN or wireless LAN to establish bidirectional communication, or the two apparatuses may alternatively be connected to each other by Wireless HD to establish bidirectional communication. Furthermore, the two apparatuses may alternatively be connected to each other on the basis of the IEEE1394 standard to establish bidirectional communication.

While the volume information of the content having the audio signal and the video signal is adjusted in each of the aforementioned first and second embodiments, the present invention is not restricted to this. According to the present invention, volume information of content having only an audio signal constituting an audio CD, an audio cassette tape, or the like may alternatively be adjusted, for example.

While processing operations of the control portion according to the present invention are described by using the flowchart described in a flow-driven manner in which processing is performed in order along a control processing flow for the convenience of illustration in each of the aforementioned first and second embodiments, the present invention is not restricted to this. According to the present invention, the processing operations of the control portion may alternatively be performed in an event-driven manner in which processing is performed on an event basis. In this case, the processing operations of the control portion may be performed in a complete event-driven manner or in a combination of an event-driven manner and a flow-driven manner.

What is claimed is:
1. An audio signal output device comprising:
an audio signal output portion to output an audio signal of content to an external device outputting audio;
a volume setting information acquisition portion to acquire volume setting information of the external device; and
a control portion acquiring maximum volume information of volume information of the audio signal of the content, wherein
the control portion performs control of lowering an output volume of audio corresponding to the audio signal which is to be output from the external device in at least the audio signal output device, before the audio corresponding to the audio signal which is to be output outputs from the external device, when a maximum output volume of the audio signal, which is to be output from the external device on the basis of both of the maximum volume information of the content and the volume setting information of the external device, is higher than a prescribed volume threshold.

2. The audio signal output device according to claim 1, wherein
the control portion notifies a user to previously select whether or not to perform control of lowering the output volume of the external device in at least the audio signal output device when the maximum output volume is higher than the prescribed volume threshold.

3. The audio signal output device according to claim 1, wherein
the control portion acquires the maximum volume information of volume information of an audio signal of the entire content or volume information of an audio signal of an entire chapter of the content and performs control of lowering an output volume of the entire content or an output volume of the entire chapter of the content of the external device in at least the audio signal output device before audio output from the external device when a maximum output volume of the external device on the basis of the maximum volume information of the content and the volume setting information of the external device is higher than the prescribed volume threshold.

4. The audio signal output device according to claim 1, wherein
the control portion performs control of lowering the output volume of the external device in at least the audio signal output device by lowering at least one of an amplification rate constituting the volume information of the audio signal of the content and an amplification rate constituting the volume setting information of the external device when the maximum output volume is higher than the prescribed volume threshold.

5. The audio signal output device according to claim 4, wherein
the control portion performs control of lowering the output volume of the external device in at least the audio signal output device by lowering the amplification rate constituting the volume information of the audio signal of the content when the maximum output volume is higher than the prescribed volume threshold.

6. The audio signal output device according to claim 5, wherein
the control portion acquires the maximum volume information of volume information of an audio signal of the entire content or volume information of an audio signal of an entire chapter of the content and performs control of lowering an output volume of the entire content or an output volume of the entire chapter of the content of the external device in at least the audio signal output device before audio output from the external device by lowering an amplification rate constituting the volume information of the audio signal of the entire content or the volume information of the audio signal of the entire chapter of the content when a maximum output volume of the external device on the basis of the maximum volume information of the content and the volume setting information of the external device is higher than the prescribed volume threshold.

7. The audio signal output device according to claim 1, wherein
the control portion acquires the maximum output volume of the external device on the basis of an amplification rate constituting the maximum volume information of the content and an amplification rate constituting the volume setting information of the external device.

8. The audio signal output device according to claim 1, further comprising a storage portion to previously store the audio signal of the content, wherein
the control portion performs control of previously acquiring the maximum volume information of the volume information of the audio signal of the content from the audio signal of the content stored in the storage portion.

9. The audio signal output device according to claim 8, wherein
the control portion previously acquires the maximum volume information of volume information of an audio signal of an entire chapter of the content stored in the storage portion for each chapter of the content and performs control of lowering an output volume of the entire chapter of the content of the external device in at least the audio signal output device before audio output from the external device when a maximum output volume of the external device on the basis of the maximum volume information of the content and the volume setting information of the external device is higher than the prescribed volume threshold.

10. The audio signal output device according to claim 1, wherein
the control portion performs control of lowering the output volume of the external device in at least the audio signal output device to set the maximum output volume substantially equal to the prescribed volume threshold when the maximum output volume is higher than the prescribed volume threshold.

11. The audio signal output device according to claim 10, wherein
the control portion performs control of lowering the output volume of the external device in at least the audio signal output device on the basis of a modification value to render the maximum output volume substantially equal to the prescribed volume threshold when the maximum output volume is higher than the prescribed volume threshold.

12. The audio signal output device according to claim 11, wherein
the control portion performs control of lowering the output volume of the external device in at least the audio signal output device by lowering at least one of an amplification rate constituting the volume information of the audio signal of the content and an amplification rate constituting the volume setting information of the external device on the basis of the modification value.

13. The audio signal output device according to claim 1, wherein the prescribed volume threshold is settable by a user.

14. The audio signal output device according to claim 13, wherein
the control portion outputs an audio signal of a test tone to set the prescribed volume threshold to the external device,
the prescribed volume threshold is set by adjusting an output volume of the test tone output from the external device.

15. The audio signal output device according to claim 2, wherein
the control portion notifies the user to previously select whether or not to perform control of lowering the output volume of the external device in at least the audio signal output device by displaying a notification screen to cause the user to previously select whether or not to perform control of lowering the output volume of the external device in at least the audio signal output device on the external device.

16. An audio output system comprising:
an external device outputting audio; and
an audio signal output device including an audio signal output portion to output an audio signal of content to the external device, a volume setting information acquisition portion to acquire volume setting information of the external device, and a control portion acquiring maximum volume information of volume information of the audio signal of the content, wherein
the control portion of the audio signal output device performs control of lowering an output volume of audio corresponding to the audio signal which is to be output from the external device in at least the audio signal output device, before the audio corresponding to the audio signal which is to be output outputs from the external device, when a maximum output volume of the audio signal, which is to be output from the external device on the basis of both of the maximum volume information of the content and the volume setting information of the external device, is higher than a prescribed volume threshold.

17. The audio output system according to claim 16, wherein
the control portion of the audio signal output device notifies a user to previously select whether or not to perform control of lowering the output volume of the external device in at least the audio signal output device when the maximum output volume is higher than the prescribed volume threshold.

18. The audio output system according to claim 16, wherein
the control portion of the audio signal output device acquires the maximum volume information of volume information of an audio signal of the entire content or volume information of an audio signal of an entire chapter of the content and performs control of lowering an output volume of the entire content or an output volume of the entire chapter of the content of the external device in at least the audio signal output device before audio output from the external device when a maximum output volume of the external device on the basis of the maximum volume information of the content and the volume setting information of the external device is higher than the prescribed volume threshold.

19. The audio output system according to claim 16, wherein
the control portion of the audio signal output device acquires the maximum output volume of the external device on the basis of an amplification rate constituting the maximum volume information of the content and an amplification rate constituting the volume setting information of the external device.

20. The audio output system according to claim 16, further comprising a storage portion to previously store the audio signal of the content, wherein
the control portion of the audio signal output device performs control of previously acquiring the maximum volume information of the volume information of the audio signal of the content from the audio signal of the content stored in the storage portion.

\* \* \* \* \*